(12) United States Patent
Wang et al.

(10) Patent No.: US 6,610,559 B2
(45) Date of Patent: Aug. 26, 2003

(54) INTEGRATED VOID-FREE PROCESS FOR ASSEMBLING A SOLDER BUMPED CHIP

(75) Inventors: Shanger Wang, Alameda, CA (US); Wushing Yin, Clinton, NY (US); Ning-Cheng Lee, New Hartford, NY (US)

(73) Assignee: Indium Corporation of America, Utica, NY (US)

( * ) Notice: Subject to any disclaimer, the term of this patent is extended or adjusted under 35 U.S.C. 154(b) by 0 days.

(21) Appl. No.: 10/014,129

(22) Filed: Nov. 16, 2001

(65) Prior Publication Data

US 2003/0096453 A1 May 22, 2003

(51) Int. Cl.$^7$ .......................... H01L 21/44; H01L 21/48; H01L 21/50
(52) U.S. Cl. .......................... 438/108; 438/127
(58) Field of Search ................ 438/108, 112, 438/118, 124, 126, 127, 612

(56) References Cited

U.S. PATENT DOCUMENTS

| | | | |
|---|---|---|---|
| 5,177,134 A | 1/1993 | Mullen, III et al. | 524/284 |
| 5,499,756 A | 3/1996 | Banerji et al. | 228/214 |
| 5,686,226 A | 11/1997 | Groman et al. | 430/325 |
| 5,704,116 A | 1/1998 | Gamota et al. | 29/840 |
| 5,710,071 A | 1/1998 | Beddingfield et al. | 438/108 |
| 5,814,401 A | 9/1998 | Gamota et al. | 428/343 |
| 5,975,408 A | 11/1999 | Goossen | 228/173.2 |
| 6,015,722 A | 1/2000 | Banks et al. | 438/108 |
| 6,048,656 A | 4/2000 | Akram et al. | 430/118 |
| 6,121,689 A | 9/2000 | Capote et al. | 257/783 |
| 6,168,972 B1 | 1/2001 | Wang et al. | 438/108 |
| 6,207,475 B1 | 3/2001 | Lin et al. | 438/108 |
| 6,399,426 B1 * | 6/2002 | Capote et al. | |
| 6,475,828 B1 | 11/2002 | Hoang | 438/108 |
| 6,506,681 B2 | 1/2003 | Grigg et al. | 438/692 |

OTHER PUBLICATIONS

*Epoxy Flip Chip Flux PK–001*, Indium Corporation of America, Form No. 97727 R0.
*Pb–Free Epoxy Flip Chip Flux PK–002*, Indium Corporation of America, Form No. 97728 R0.

* cited by examiner

Primary Examiner—David Nelms
Assistant Examiner—Phuc T. Dang
(74) Attorney, Agent, or Firm—Weingarten, Schurgin, Gagnebin & Lebovici LLP

(57) ABSTRACT

An integrated void-free process has been developed for attaching a solder bumped chip to a substrate. The chip is first dipped in a tacky thermosettable flux, and the chip is mounted on the substrate. An underfill is dispensed along the edge of the chip The device is then sent into the reflow furnace to complete the underfilling (which optionally can be completed before reflow), solder reflowing and underfill curing. The flux also acts as a physical barrier minimizing, if not eliminating, the interference of filler on solder wetting and resulting metallurgical joints formed between the solder and the bond pads. The process allows for the integration of a void free conventional capillary flow underfilling process and a pre-deposited fluxing underfilling process by using a tacky thermosettable flux, avoiding the problems associated with each of the individual processes and requiring less time for the overall process.

13 Claims, 10 Drawing Sheets

INTEGRATED VOID-FREE PROCESS FOR ASSEMBLING A SOLDER BUMPED CHIP

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

This invention relates generally to a method of assembling a semiconductor chip electrically and mechanically connected to a substrate, particularly in a flip chip configuration.

Assembly of solder bumped chips such as flip chip or chip scale package (SCP) is an emerging technology which satisfies the demands of the ever-increasing requirements for high I/O density, small form factor, and improved performance in integrated circuit (IC) design. In the process of chip assembly, a chip is mounted on a substrate with any kind of interconnect material. Among the many kinds of interconnect materials, solder has remained a predominant choice. Solder bumped chip assembly consists two major steps: (1) chip soldering and (2) underfill encapsulation. To attach chip to the substrate, a flux is applied to the substrate or solder bumps on the chip. The chip is then aligned with the bond pads on the substrate, placed, and reflowed, forming electrical connections and mechanical joints between flip chip and substrate. After soldering a solvent cleaning step is usually involved to remove the flux residue which otherwise weakens the underfill adhesion which in turn degrades solder joint reliability. The cleaning process is a difficult operation, often costly and time consuming, involving solvents and expensive equipments. Therefore, there is a need to develop a new technology that does not require this cleaning process.

Another issue in the implementation of solder bumped chip technology when applied to organic polymer substrate is the mismatch of the coefficient of thermal expansion (CTE) of the chip, and that of the substrate having a higher CTE. The build up stress on solder joints upon thermal excursions experienced during the application of the device causes solder joint fatigue and leads to the failure of the interconnect joints. To minimize this problem, an underfill material is applied in the interspace of chip and substrate after chip soldering to assure the reliability and electric integrity. The traditional underfill material is typically a highly flowable liquid formulation, containing filler particles to reduce CTE. The underfill material is dispensed along the edges of the chip and allowed to wick into the space between the substate and the chip. The capillary action allows the underfill to flow out to the opposite sides of the chip and completely fill the gap between the chip and the substrate. Even though the substrate is usually heated to an elevated temperature to facilitate the underfill flow, the process still takes more than seconds to completely underfill the chip, which is considered a bottle neck in manufacturing process. After underfilling, the package is subjected to an elevated temperature for underfill curing. The cured underfill material redirects or redistributes the stress away from tiny solder joints, thus enhancing the package reliability. In addition, underfill materials also serve as mechanical and environmental protection, which increases the resistance to shock, vibration, moisture, solvent, and provide thermal dissipation between chip and substrate.

While traditional capillary flow underfill materials with reduced flow and cure time are dominant in current underfill applications, the use of so-called pre-deposit fluxing underfill offers an attractive alternative which would speed up package processing and enhance compatibility with surface mount technology (SMT). In addition to bearing the functions provided by traditional underfill encapsulant, the pre-deposit underfill materials are integrated with fluxing capability. The overall assembly process based on this type of underfill material is simplified by combining three basic steps: (1) underfill dispensing, (2) chip placement, and (3) reflow. During reflow, the fluxing agent incorporated in underfill materials provides sufficient activity to remove surface oxide on solder bumps and bond pads, forming interconnect joints. In the meantime, the underfill material is chemically crosslinked, forming a strong network structure providing mechanical and environmental protection as described for traditional underfill encapsulation. The benefits of the pre-deposit underfill process are well explored in the recent years. These include simpler process to control, higher throughput, self-fluxing action, etc. Even though there has been an explosion of interest and great effort to develop this technology throughout the past decade, the use of pre-deposit underfill is, however, not without its inherent problems and limitations. One of the obstacles which pre-deposited fluxing underfill materials must overcome, is placement of the component without void entrapment. A direct consequence of underfill pre-deposit followed by fast paced chip placement (less then a second), is that the underfill material is forced to flow toward the periphery of the chip in such a short time that air is entrapped around solder bumps (FIG. 2). These air bubbles will generate internal vapor pressure when the temperature increases during reflow, leading to process failures such as chip float and misalignment of solder bumps relative to the matching bond pads. Furthermore, the trapped air bubbles around solder joints pose a great threat to the solder joint performance, defects such as irregularity, solder extrusion, incomplete wetting, voids inside joint are often encountered. Yet, another challenge of developing such pre-deposit fluxing underfill materials is the interference of inorganic filler particles on soldering during reflow as solid filler particles will inhibit the solder wetting on bonding pads. How to incorporate fillers into pre-deposit fluxing underfill to reduce CTE and apply such pre-deposit underfill in manufacture processing remains uncertain. As a result, the pre-deposit underfill typically contains no filler, thus has a CTE much higher than that of capillary flow underfill and therefore unparallel performance.

It would be desirable to develop a method that takes advantages of capillary flow underfill process, such as void free, low CTE, widely accepted industry processing practice, and combines the attractive features of fluxing underfill such as shorter manufacturing cycle, no cleaning step required, underfill cured in the same step as solder reflow, and SMT processing compatibility. Such a processing method should yield overall higher efficiency, and low cost without compromising the reliability and performance.

BRIEF SUMMARY OF THE INVENTION

The present invention provides a method of assembling a substrate and an IC die in a flip chip configuration using a tacky thermosettable flux and underfilling such a device. According to the present invention, as described in the illustrated embodiments, a thin layer of tacky flux is applied to the substrate or preferably to the solder bumps, a chip is placed on the substrate with the solder bumps in contact with the matching bonding pads. The tacky flux provides temporary adhesive bonding to immobilize the chip. An underfill is then dispensed along the edges of the chip and the whole package is transferred to reflow process. During solder reflow process, three major processing tasks are accomplished in one single step: (1) the underfill flows into the gap between chip and substrate and completely fills the interspace, (2) the tacky flux activates the bonding surface and facilitates solder reflow and joint formation, (3) underfill curing. Because tacky flux is formulated to be compatible with underfill, it is chemically incorporated into the cured underfill network structure.

In one aspect of present invention there is provided an integrated method of underfilling a device on a substrate during reflow process. The method comprises applying tacky flux to solder bumps or substrate to be joined and placing the chip on substrate so that the chip is temporarily held in place. The underfill is deposited on the substrate along the edges of the chip and the whole device is subjected to a reflow process. In general, a reflow process can be roughly divided into four major stages: heating stage, soaking stage, and the reflow and cooling stage. The viscosity of underfill material is reduced as the temperature of the whole device is gradually increased in the heating stage, this will facilitate the underfill to flow into the gap, as a result, the gap is completely filled with underfill material before the temperature reaches the solder melting point. Because the underfill is allowed to flow, via capillary action, into the gap between chip and substrate, the underfill material is able to wet any surface in contact and replace the air space underneath the die with underfill material, avoiding the formation of air bubbles. The incorporation of underfilling into the solder reflow process removes the typical bottleneck of the manufacturing process, thus significantly shortening the manufacturing cycle.

Another aspect of the present invention is increased gap height during the underfilling process. Because the device is underfilled before reflow and solder collapse, the maximum clearance between chip and substrate for the underfill process is increased. The size of the gap is controlled by the height of solder bumps and typically varies from 3 to 30 mils. With the increase of I/O density in IC devices, the solder bumps (i.e., the clearance between the chip and the substrate) are becoming even smaller. This reduced height presents a greater challenge for the underfill, making capillary flow more difficult and increasing the time needed to fill the gap. Typically, depending on the pad design and layout, there is a 15–30% drop in the clearance after solder reflow in C4 (controlled collapse chip connection) process, this clearance drop further increases the chance of introducing underfill defects such as voids, filler segregation, and increased flow time. Underfilling before soldering provides the maximum clearance for the underfilling process.

In another aspect of present invention, a uniform fillet is formed after solder reflow. Traditional process of chip bonding first followed by underfill dispensing tends to create a non-uniform fillet around the chip. Typically, the fillet will be large enough on the one or two sides of chip where the underfill is originally dispensed and there is not enough underfill material flowing out to the other sides of the chip to form a desirable fillet profile. An additional dispensing operation is usually required to compensate the material deficiency on the other sides, which also brings in additional manufacturing time. Underfilling before solder collapse assures the formation of uniform fillet. Upon solder collapse, the chip will force the additional underfill material to flow out to the edges of the chip, providing enough material to form a desirable fillet.

In another aspect of present invention, a tacky flux is provided to block the interference of filler particles on the solder joint formation. The current process of pre-deposit fluxing underfill does not allow the use of underfill material with a high percentage of filler to achieve a sufficiently low CTE, usually around 25–45 ppm/° C. Use of high percentage of filler content inhibits solder wetting on bond pads, thus preventing the formation of a desirable solder joint. This is why current formulations of this type of pre-deposit fluxing underfill usually contain no or very low percentages of fillers. The resulted high CTE of the material limits the performance of the final package. The process of the present invention takes advantage of tacky flux to prevent the interference of filler during solder reflow, with the tacky flux forming a thin layer adhering to the contacting bump and pad, and acting as physical barrier to the filler intrusion. A 100% interconnect yield can be achieved reproducibly.

DETAILED DESCRIPTION OF THE INVENTION

Figure 1:
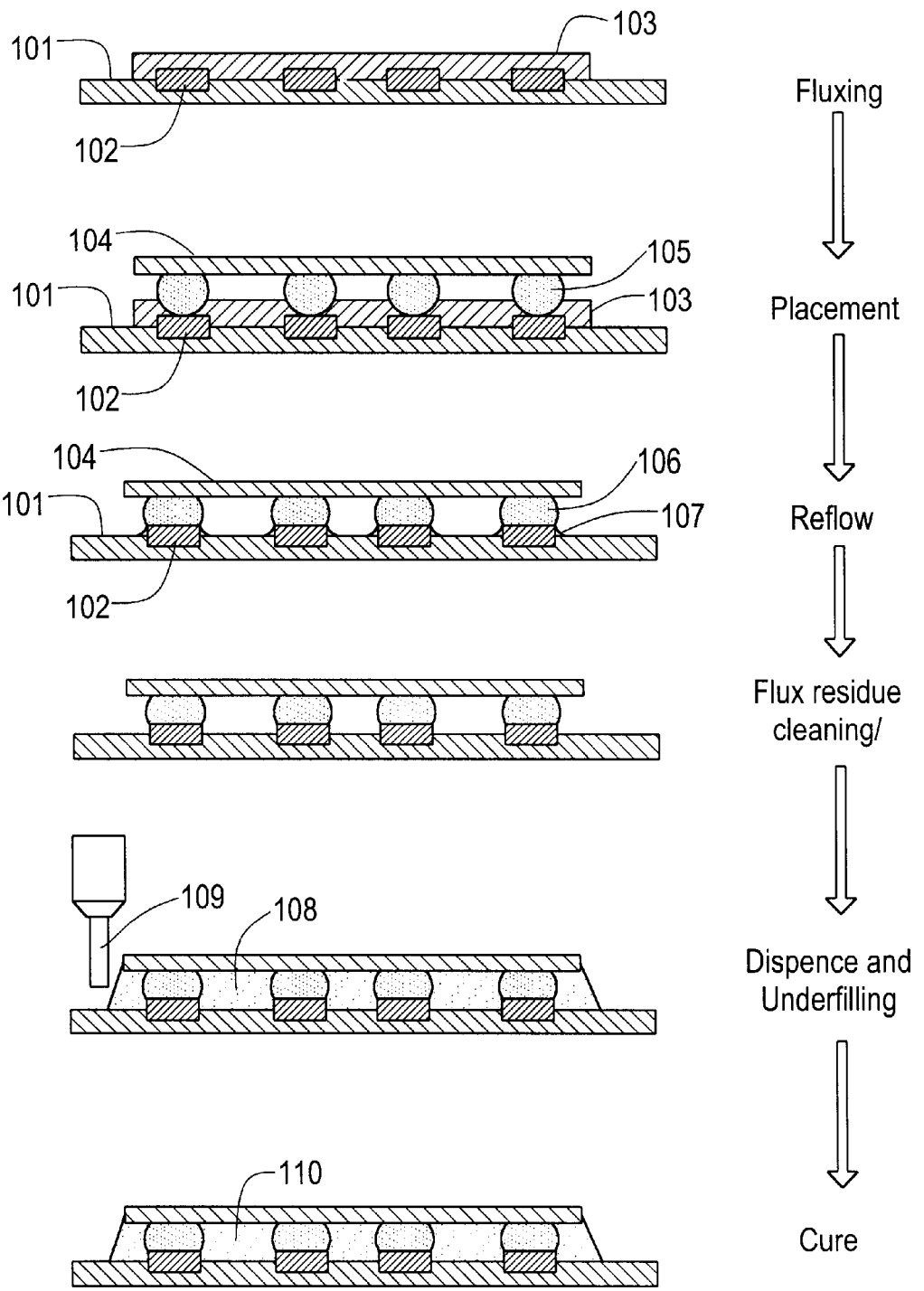
FIG. 1 is a process flow chart illustrating the steps for assembling a chip and substrate in accordance with conventional capillary flow underfill process.

A new integrated void free process for assembling solder bumped chips such as flip chip or chip scale packages (CSP) using a tacky thermosettable flux is provided. The tacky flux is not only sufficiently tacky to keep the chip attached to the substrate while other processing (e.g., addition of the underfill) takes place, but also fully compatible with underfill and will not cause delamination. The traditional tacky fluxes were generally incompatible with underfills and caused delamination of the underfills. They were used with "regular" soldering, processes in which underfills were not used. These traditional products contained much resin (which added the stickiness to the product), along with solvent and activator.

By tacky thermosettable flux, we mean a flux which is flowable before reflow, provides good flux properties (e.g., removal of oxides, etc.), and, after reflow, is cross-linked to form a thermosetting polymer. Examples of tacky thermosettable flux include epoxy fluxes, polyimide fluxes, polyacrylate fluxes, polyurethane fluxes, and combinations thereof. Other polymers that perform similarly also can be used, either individually or in combination with other such fluxes.

Furthermore, the area of prime interest herein is the new process that results from use of the new tacky thermosettable flux. As indicated in more detail below, the new process allows the combination of several steps that were previous conducted separately, thus simplifying the underfilling, reflow and curing steps. Furthermore, the resulting IC has a much lower failure rate, due to the absence of underfill voids in the new process. It should be noted that, although several tacky fluxes are disclosed herein, the new process is not confined to the use of those fluxes. Instead, any flux that is sufficiently sticky to hold the chip to the substrate during the steps discussed can be used in the new process. (I.e., the flux must be sufficiently sticky to prevent the component from floating away.)

The tacky flux is first applied to the solder bumps or substrate using conventional methods followed by placement of the chip onto the substrate so that the solder bumps are in contact with the substrate bond pads. The underfill is then dispensed along the edges of the chip and the device is transferred to a reflow cycle. During the reflow heating, the underfill material flows into the space between chip and substrate, driven by capillary action, leaving no entrapped voids in the underfill. In the meantime, the device is reflowed and cured. The tacky epoxy flux is designed to provide temporary adhesion between the electronic components and substrate as well as provide fluxing activity for soldering during reflow. The tacky flux can be composed of one or more fluxing agents and a combination of epoxy (or other fluxes listed above), hardener, and/or curing agent. The tacky epoxy flux is formulated to have similar chemical nature as epoxy based underfill materials and thereby will be incorporated into the final polymer network structure through diffusion and chemical reaction after reflow, without deterioration of the underfill performance. The tackiness is provided by the high molecular weight epoxy, hardener, or the combination of the two. The new process consolidates underfilling, solder reflow, and underfill curing into a one-step reflow process, thereby simplifying the flip chip packaging process which otherwise requires separate solder reflow and underfilling steps. The new process combines the advantages of conventional void free capillary flow underfill process and simple pre-deposit fluxing underfill process, and therefore optimizes the manufacturing process without compromising any performance requirements. The tacky flux will prevent the chip from floating, which will cause misalignment between bond pad and solder bumps. The sequence of underfilling before solder reflow facilitates underfill flow because of the increased clearance between the chip and substrate created by the unreflowed solder bumps.

FIG. 1 illustrates the typical process of assembling a chip and a substrate or chip carrier by conventional capillary flow underfilling. The substrate (101) typically comprises silicon, ceramic, glass, FR-4, BCB, polyimide, or combination thereof, and is fabricated as printed circuit board (PCB) or chip carrier used in flip-chip technology. The substrate has coplanar metallurgical bond pads (102). The flux is applied to the substrate as a thin film (103) using various flux application methods such as spray, brushing, pin transferring and printing. Alternatively, the flux can be applied to the solder bumps attached to the flip chip by dipping the solder bumps into a thin layer of flux on a motorized flux tray (not shown). The bumps can be Pb-based or Pb-free solder alloys. A chip (104) is shown mounted on a substrate (101) with solder bumps (105) connected to the chip aligned with the bond pads (102) of the substrate (101). During reflow, the flux (103) removes the oxide on the surface of solder bumps (105) attached to the chip (104) and the oxide on the bond pads (102) on the substrate (101), a mechanical and electrical solder joint (106) is thus formed between chip (104) and substrate (101). The chip/substrate combination is cleaned to remove the flux residue (107) which otherwise, will hinder the underfill flow and degrade the adhesion of underfill to the substrate, chip and solder joints. An underfill material (108) is dispensed through a needle (109) and deposited along the edges of bonded chip using predetermined patterns such as one-side, L type pattern, double L pass, or L pass followed by another L pass on the opposite sides. The underfill material (108) is allowed to wick into the gap formed between bottom side of the chip and the top of the substrate by capillary action. The underfill flow process is usually facilitated by heating the substrate to a temperature T2, which is dependent upon the flux used and is described in more detail later herein. Generally, the temperature is between approximately 20 and 130° C. The flow process can be completed in a matter of seconds depending on chip size, clearance between chip and substrate, I/O density, and the selected underfill material. As the result of capillary flow, the underfill material is able to replace any air in the interspace between chip and substrate. After underfilling, the whole device is subjected to a high temperature curing process which can be varied from few minutes to few hours. A mechanically strong and stable adhesive layer (110) is formed between chip and substrate, providing stress relief and environmental protection to the package.

Figure 2:
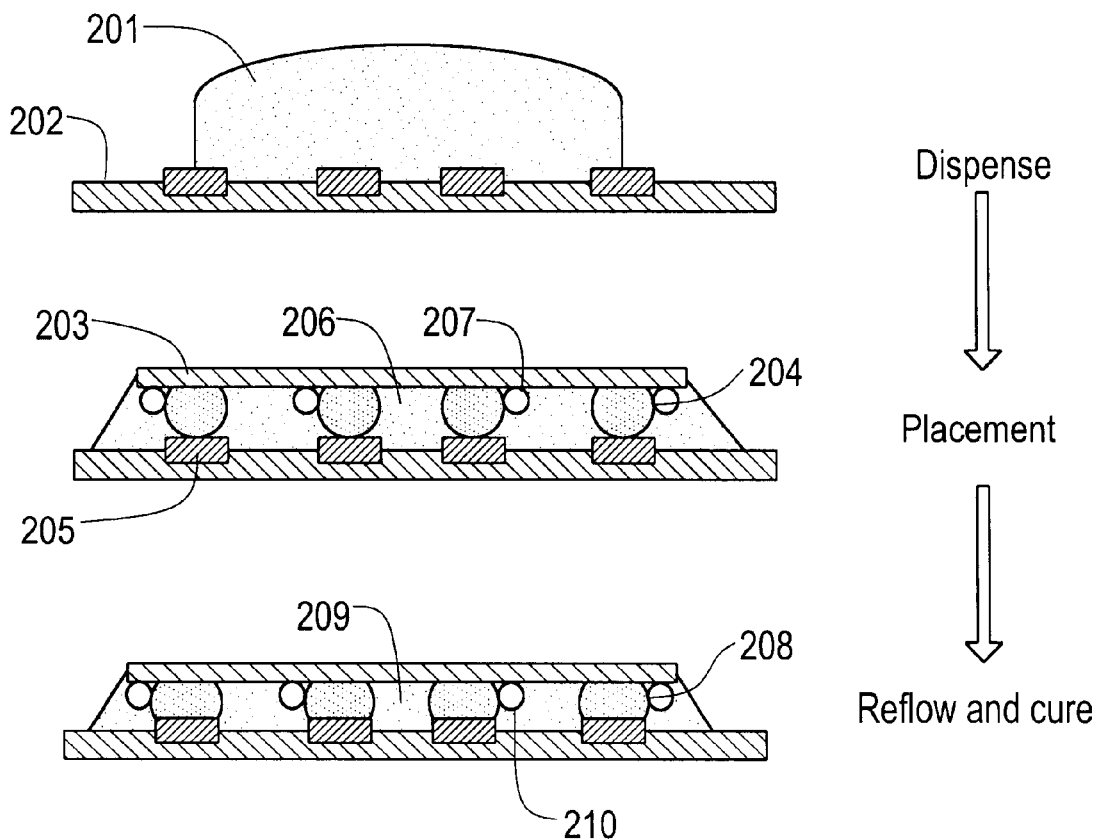
FIG. 2 is a process flow chart illustrating the steps for assembling a chip and substrate in accordance with pre-deposit fluxing underfill process.
Figure 3A:
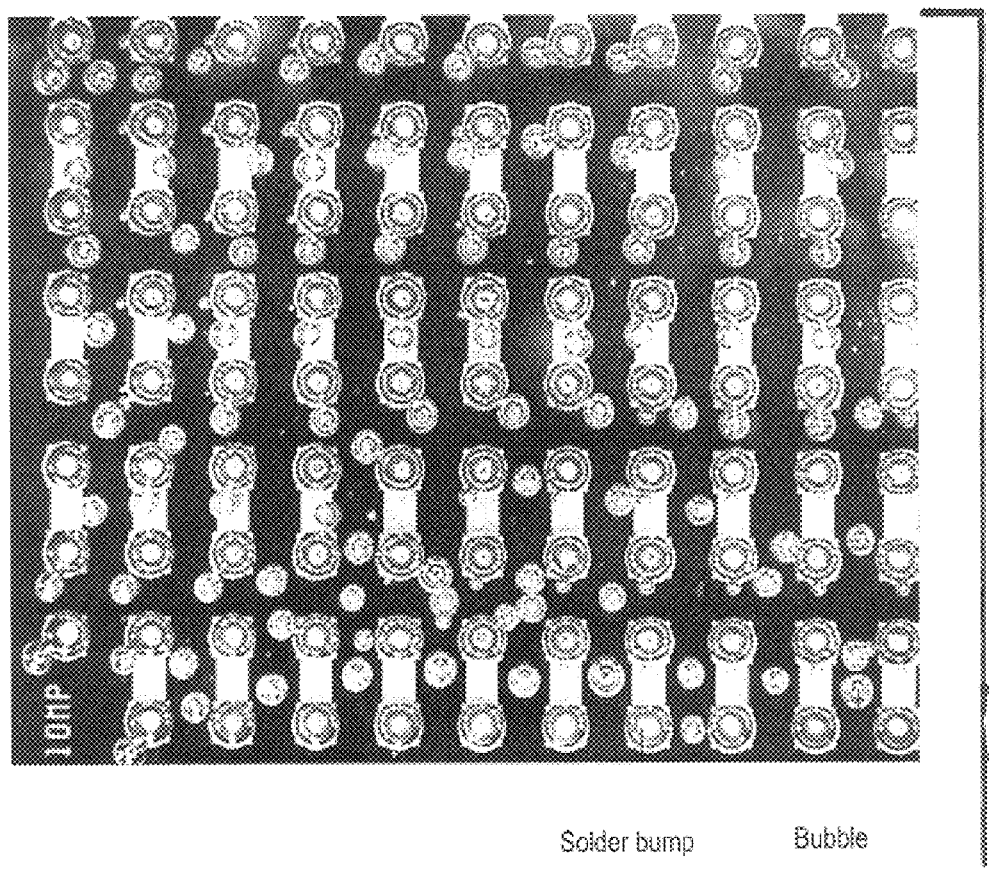
FIG. 3 is the comparison of entrapped voids after chip placement on glass substrate using different process: (A) pre-deposit underfill process, (B) pre-deposit underfill process after cure, and (C) the present integrated process. Flip Chip Technology FA10-200 on glass substrate with 5 mil bump diameter and 10 mil pitch is used for this illustration.
Figure 3B:
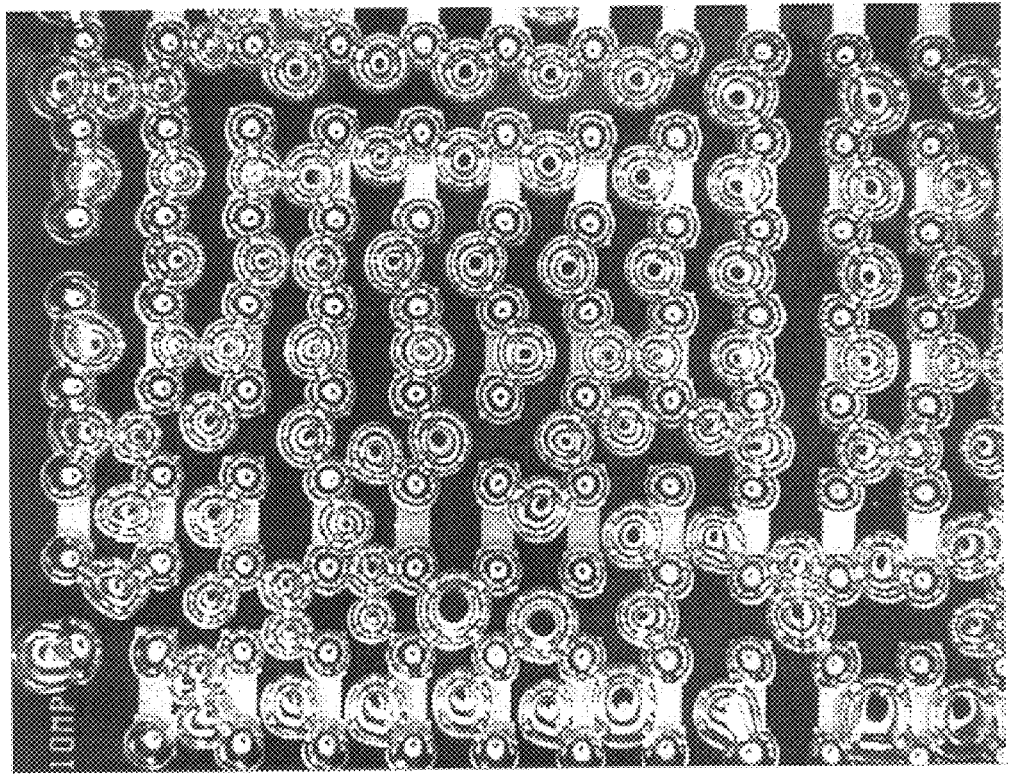

While conventional capillary flow underfills now possess improved flow speed and cure rate, they still require a few more processing steps beyond the typical SMT process which typically consists of solder paste or flux deposition, component placement, and reflow soldering. In recent years, pre-deposit fluxing underfill materials have been extensively explored in order to meet the demand of low cost, high throughput, and SMT compatibility. The overall manufacturing process is simplified significantly as illustrated in FIG. 2. The underfill material (201) is deposited, in a desired pattern, onto the substrate (202), which has been baked beforehand to release any surface moisture. A solder bumped chip (203) is mounted onto the substrate with solder bumps (204) aligned to the corresponding bond pads of the substrate (205) in a one-to-one fashion. During the same reflow process as used for reflowing solder paste, the underfill material (206) provides the fluxing capability to assist the formation of solder joint (208) and undergoes a curing reaction to form a protective underfill layer (209). Although extensive effort has been made to promote this technology, many problems still exist as this moves into real world of applications. One of the inherent problems is the void entrapped during chip placement. This is because the underfill material (206) is unable to fully wet the surface and expel the air out of the space between chip and substrate before fast paced chip placement (typically less than one second) is completed. A confined air bubble (207) is formed around the corner of each individual solder bump, mostly behind solder bumps along the underfill flow direction. This situation becomes more significant when a fully populated area array solder bumped chip is used as demonstrated in FIG. 3(A). These air bubbles, with diameters about one-third to half the diameter of solder balls, pose a great threat to the integrity of solder joint reliability. Solder joint failure such as solder extrusion, and joint cracking has been reported due to the presence of these voids (210) in the cured underfill. The situation can be worsened when these air bubbles expand and/or merge to form bigger bubbles (FIG. 3(B)), thus causing a greater chance of chip floating or solder joint failure.

The present invention provides an integrated solution to the problems associated with the prior art and takes advantages of capillary flow void free underfilling and a simplified manufacturing process. These advantages will be made clear in the following detailed description and accompanying drawings of the present invention.

Figure 4:
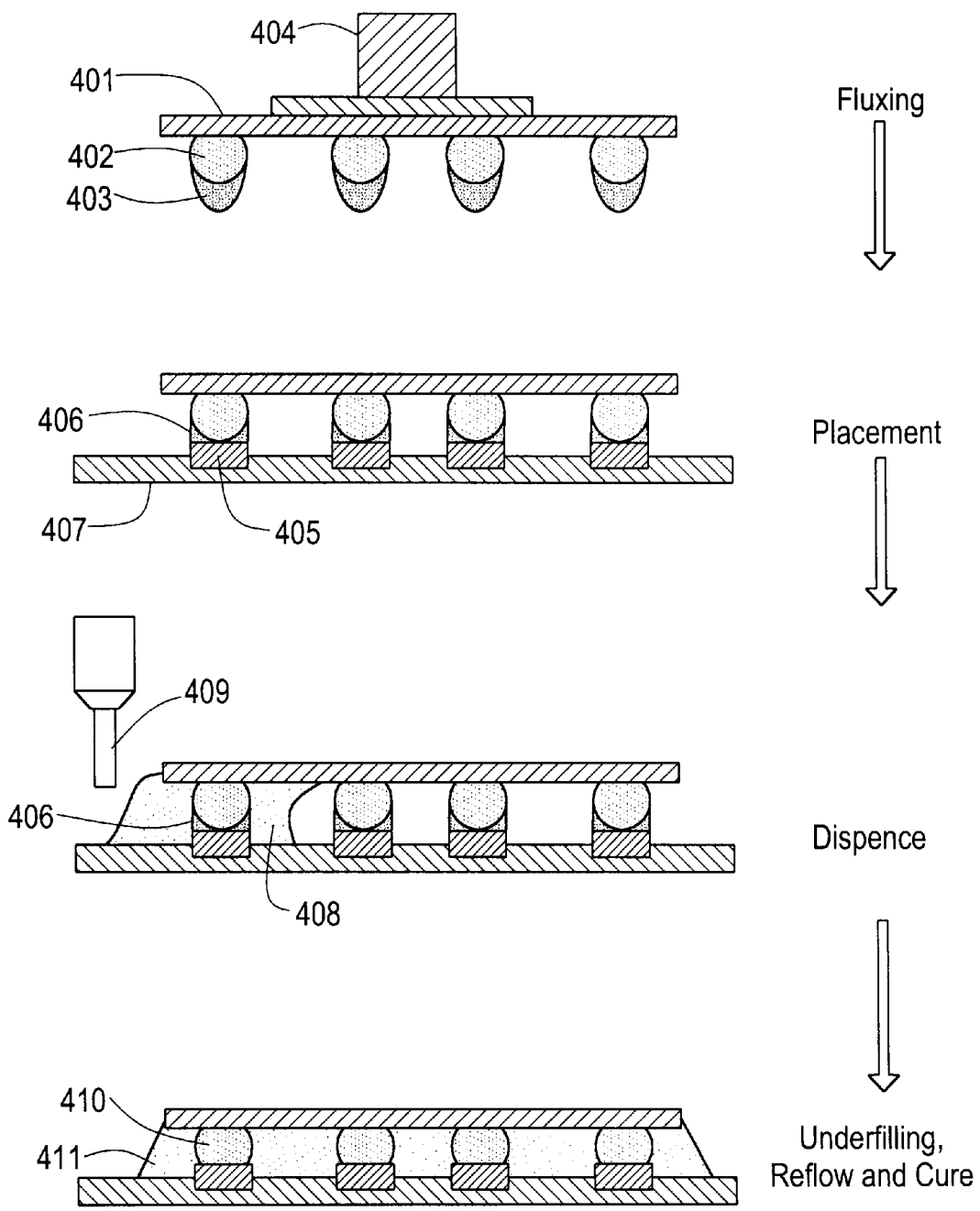
FIG. 4 is a process flow chart illustrating the steps for assembling a chip and in accordance with present invention-option 1.

Illustrated in FIG. 4 is representative of the processes for assembling a chip in accordance with the present invention. The process begins with the application of tacky epoxy flux (403) on either substrate (407) or solder bumps (402) attached to a chip (401). There are several methods available for applying tacky flux to a substrate or solder bumps. For examples, brushing, printing, spraying, roller coating, pin transferring, or dispensing are well known techniques used in this field. Another method, often called flux dipping, involves the use of rotary drum having a doctor blade to control the flux thickness. The rotary drum has a temperature controller, providing a proper viscosity, to enable a high volume manufacturing process. These rotary drum flux applicators are readily available from pick and place machine vendors. The tacky epoxy flux has sufficient chemical activity to activate solder bumps to form reliable solder joints with bond pads, sufficient tacky force to adhere the substrate and pre-aligned chip during underfilling, and a proper viscosity to enable high volume manufacturing process. The tacky epoxy flux is typically composed of one or more fluxing agents, and a combination of tacky epoxy, hardener, and/or curing agent. (As indicated above, other types of fluxes, such as polyimide fluxes, can also be utilized.) The tacky flux is formulated with compositions compatible with or similar to underfill composition and therefore will be incorporated into the adhesive network structure after reflow heating cycle. In this context the word compatible means that the tacky fluxes are composed of chemicals which are reactive to the epoxy or other compositions in underfill material. During reflow heating, the tacky flux is solublized in the underfill material and become a part of the net work structure after curing.

Examples of tacky fluxes include PK-001 and PK-002, products sold by Indium Corporation of America. One example of a tacky epoxy flux that can be applied at an ambient temperature is PK-X003 manufactured by Indium Corporation of America, the room temperature Brookfield viscosity of this material is around 50000 cps. However, it should be emphasized that other tacky fluxes can also be used.

One example of an underfill that can be used along with this epoxy flux is UF-X10, also manufactured by Indium Corporation of America. The Brookfield viscosity of this underfill is around 3000 cps at room temperature. Note that the underfill can contain additional flux to further improve the efficiency of the reflow process.

The flux is based on epoxy chemistry, for example, in order to be compatible with epoxy based underfill (if epoxy underfill is the type used). The flux often appears to be brownish tacky paste and can be applied at 25° C. using various method such as dipping, printing or pin-transferring.

Alternatively, the tacky epoxy flux can be moderately heated to achieve a proper viscosity for the flux application. In case of dipping fluxing, the pick and place arm (404) picks the chip (401) and dips the solder bumps (402) into a thin flux film on the rotary drum which has been preset a temperature $T_1$, depending on nature of flux For example, $T_1$ for PK-001 (an epoxy flux) is approximately 40–70 C. A sufficient amount of tacky flux (403) is picked up and transferred on the surface of solder bumps facing toward the substrate. The chip (401) is mounted onto the substrate (407) with the individual bumps (402) in contact with corresponding bonding pads (405). A thin layer of tacky flux (406) temporary holds the solder bumps (402) and bonding pads (405) together and prevents the chip (401) from shifting during the next process.

Figure 3C:
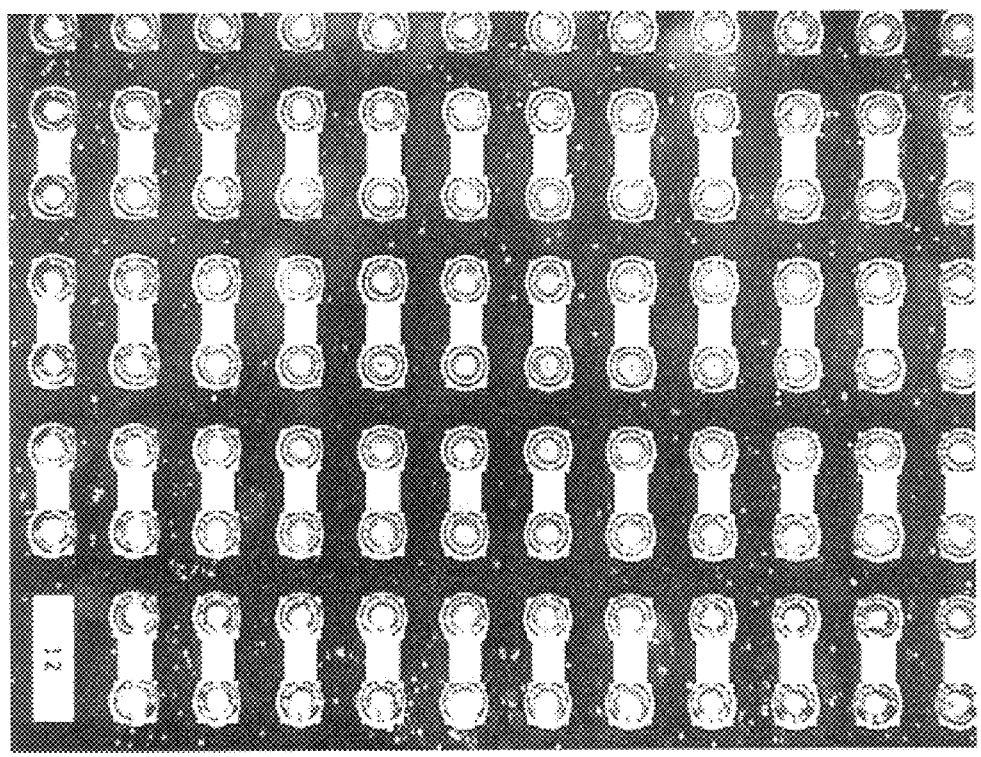
Figure 7:
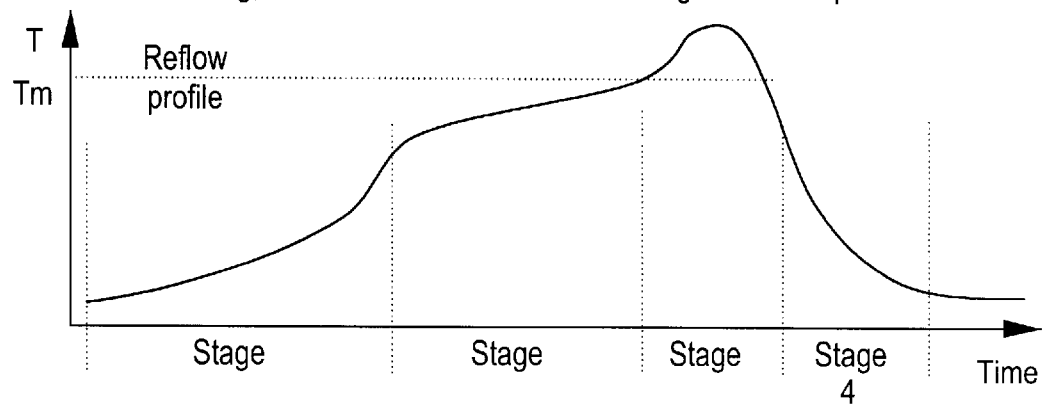
FIG. 7 shows the integration of underfill, curing and solder bump reflow into one reflow step. The underfilling process can be completed in a reflow oven or before the package is sent into a reflow oven. Also shown is the typical reflow profile described in four stages: (1) heating stage, (2) soaking stage, (3) reflow and (4) cooling stage.
Figure 7:
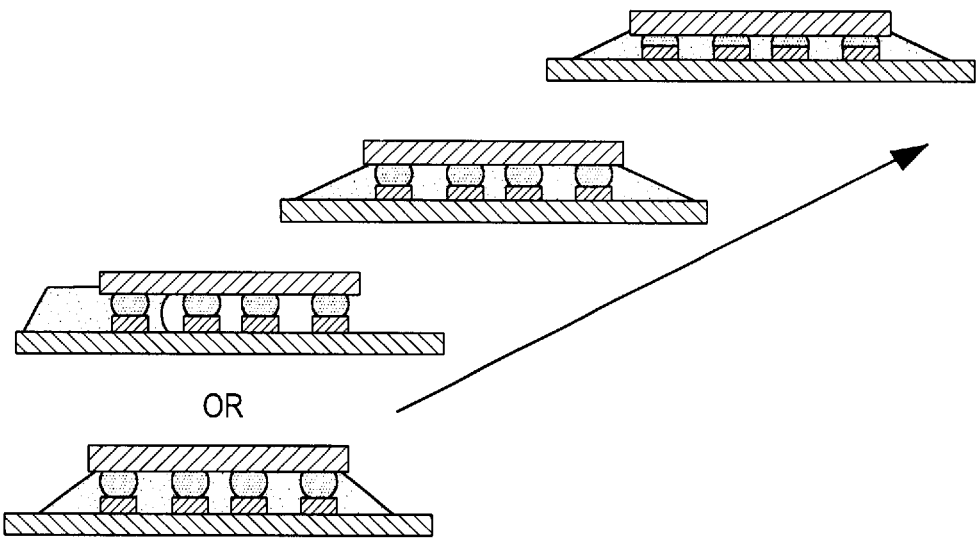

Underfill (408) is deposited along the edges of the chip in the desired pattern using a dispensing needle (409) attached to a dispensing machine. The whole device is then subjected to a heating cycle as commonly used for solder paste reflow. During this heating cycle, three major tasks are accomplished: (1) during the heating stage, the underfill material (408) flows into the gap between chip (401) and substrate (407) by capillary force and completely replaces the air in the gap prior to the solder melting, therefore leaving no air bubbles in the underfill (FIG. 3(C)), and the tacky epoxy flux (406) provides enough tack force to hold the component in place, (2) the tacky flux and fluxing component in underfill material activate the solder bump and bond pad surface on the substrate facilitating the formation of the new solder joints (410), (3) the underfill material completes curing to form a strong adhesive layer (411), thus providing mechanical, electrical, and environmental protection for the electronic device. Since the tacky flux (406) is compatible with the epoxy underfill (408), it will completely merge and react with the underfill matrix at the elevated temperature and become part of the network structure after curing, and therefore does not adversely affect the solder joints. The overall process can be simplified as:

1. Dip fluxing at $T_1$.
2. Place chip (401) on substrate (407) at $T_2$, where the temperature $T_2$ is not too high so that the tacky thermosettable flux (406) will provide sufficient adhesion to hold the chip (401) in place during underfilling; the tacky epoxy flux (406) also provides a physical barrier against filler penetration into the bonding area of solder bumps (402) and bond pads (405). The temperature T2 is dependent upon the type of tacky thermosettable flux chosen. For example, T2 for PK-X003 has a T2 of approximately 30–120 C, while PK-002 has a T2 of approximately 20–100 C.
3. Underfilling, reflow soldering and underfill curing in one single reflow heating cycle. This process can be conducted in, for example, a forced air convection oven, such as a BTU VIP 70, using a defined curing profile (e.g., ramping up linearly from room temperature to 220° C. at a ramp rate of 1° C./sec, then cooling down at a ramp rate of 2° C./sec. FIG. 7 shows an example of such a heating profile.) The tacky epoxy flux (406) will also be cured and incorporated within underfill matrix.

Figure 5A:
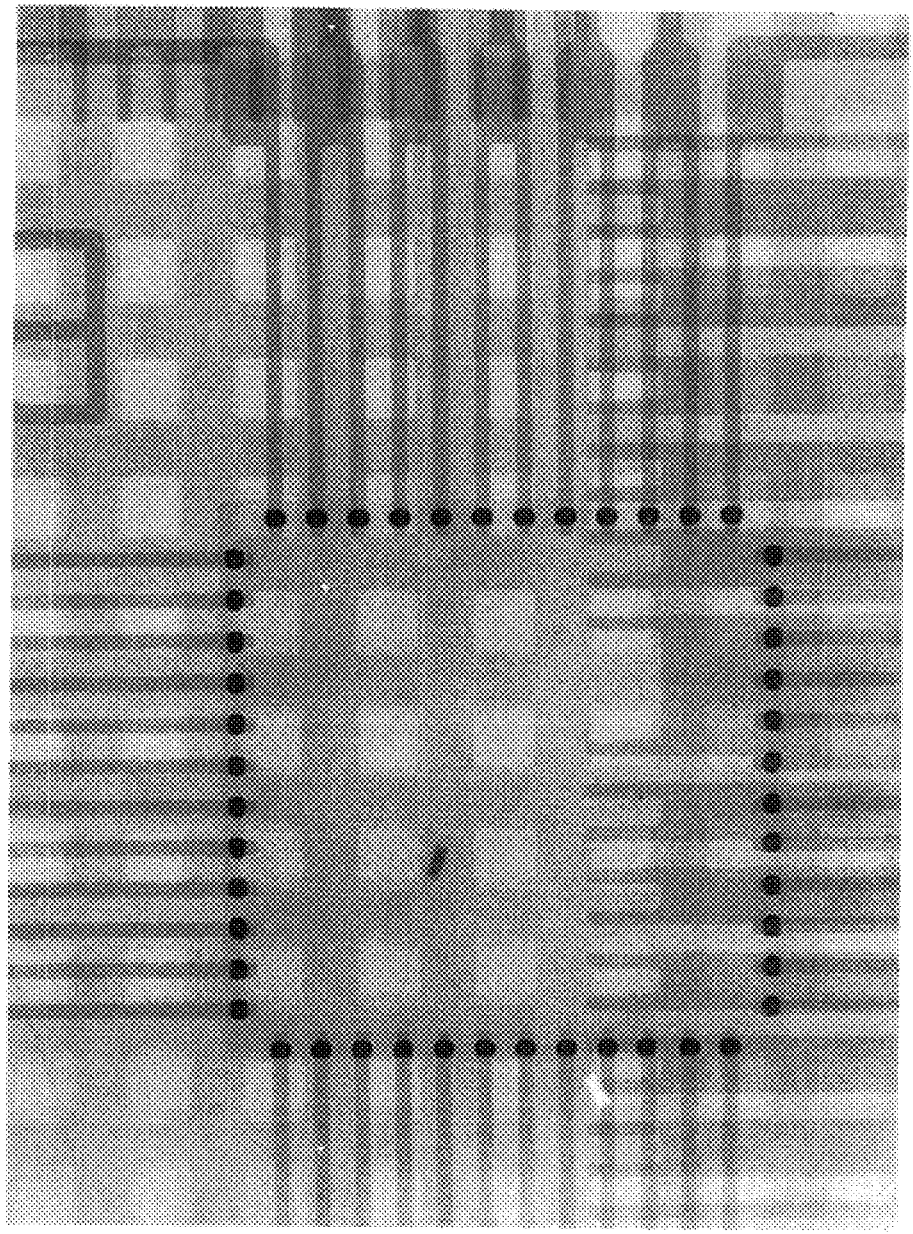
FIG. 5 is the x-ray images of assembled Flip Chip FB250 with organic surface protection (OSP) coating on pads using the process in accordance with the present invention-option 1. Indium tacky epoxy flux PK-X003 and underfill UF-X10 containing 20% filler (A) and 40% filler (B) is used for this illustration.
Figure 5B:
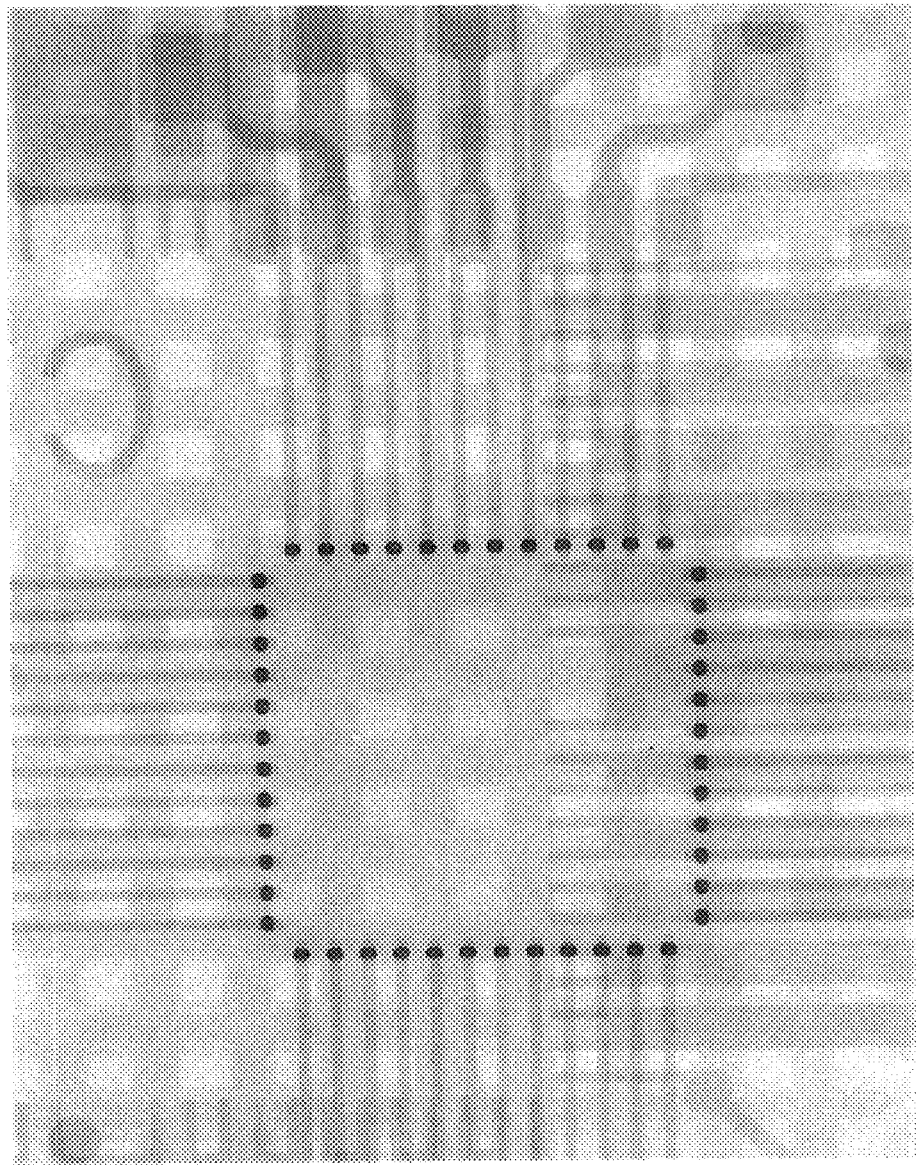

As an example, Flip Chip FB250 daisy chain chip was assembled using Indium tacky epoxy flux PK-X003 and Indium underfill UF-X10, 100% solder joint yield was obtained reproducibly using this process (FIG. 5(A) and (B)). FIG. 5A shows an x-ray of the completed Flip Chip using 20% filler (e.g., silica), while the chip in FIG. 5B used 40% of the filler. By comparing these 2 x-rays, we can tell that the variation in filler had no impact on the new process described herein. (I.e., the figures are similar.)

Figure 6:
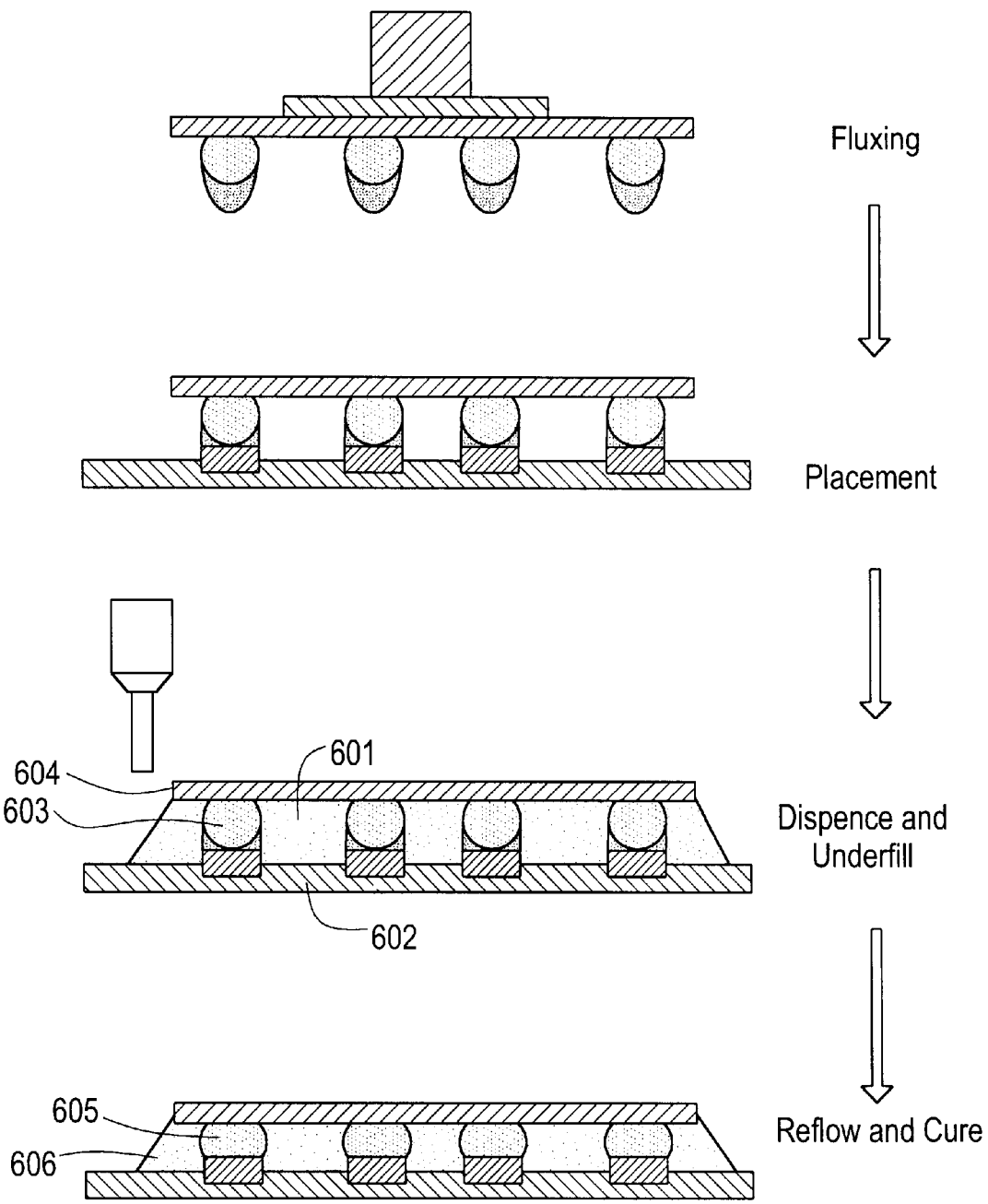
FIG. 6 is a process flow chart illustrating the steps for assembling a chip and substrate in accordance with present invention-option 2.

Alternatively (Option 2), the underfilling process may be completed prior to the reflow processing as illustrated in FIG. 6. Instead of sending the device into reflow oven for the completion of underfilling, the underfill material is allowed to completely fill the gap and flow out to the edges of the chip before entering reflow process. (Note that the term "soaking" is frequently used to describe that part of the process that takes place when the product is in the oven, when the temperature is kept nearly constant, in order to allow the underfill to flow under the chip and not begin the curing process. See, for example, Stage 2 in FIG. 7.) This is especially useful when a large chip is to be underfilled as more underfill material is needed to fill the gap. Compared with option (1), the first two steps of option (2), fluxing and placement are the same as option (1) as described in FIG. 4. Following chip placement, regular underfill dispensing pattern such as one side pass, one side pass followed by another one side pass, L-type (i.e., 2 adjacent sides) pass or L-type pass followed by another L-type pass when underfill (601) flows out to the opposite side of the die is applied, the preferred dispensing pattern is selected to offer best chance to have no or minimal voids in a shortest underfilling time and create ideal fillet geometry. The substrate (602) may be heated to an elevated temperature $T_2$ to assist underfill (601) flow as commonly used for capillary flow underfill processing. The tacky epoxy flux (603) provides sufficient adhesion to hold the chip (604) in alignment with the substrate (602) during underfilling, preventing the chip (604) from floating and shifting. The tacky epoxy flux (603) also serves as a protective layer to prevent the filler of the underfill from interfering with solder joint formation. After this separate underfilling step, the device is subjected to a standard reflow process as used for the process of pre-deposit underfilling to establish interconnected solder joints (605) and form a desirable underfill layer (606). Compared to the capillary flow underfill processing, the present invention requires no separate fluxing and bonding processes, and flux residue cleaning step is also eliminated. The whole assembly process for Option 2 has been summarized as:

1. Dipping fluxing at $T_1$.
2. Place chip on substrate at $T_2$, where the temperature $T_2$ is not too high so that the tacky epoxy flux maintains sufficient bonding strength between the chip and substrate to prevent any misalignment during underfilling.
3. Dispensing and capillary flow underfilling as used for conventional capillary flow underfill.
4. Reflow and cure.

It is easy to understand that the process involves no placement void issue as encountered in pre-deposit underfill processing. Some other assisting measures used for capillary flow underfilling as demonstrated in existing processes are also suitable for the present invention, such as: 1. Providing a hole in the middle of substrate and allowing the underfill material to flow towards the center from entire perimeter, 2. Using dams to guide the underfill flow and apply a vacuum source to draw underfill material from one open end of the dam to the opening at the opposite end.

Application of the present invention does not restrict the means in which the tacky flux is applied. Other conventional methods such as printing, pin-transferring, dispensing, are equally applicable. Likewise, the surface to which the flux is deposited is also variable. The tacky flux can be placed on the solder bump surface facing toward the substrate or on substrate bond pads or other active surface for bonding. One way of assembling a chip is to pin transfer the tacky flux onto the bond pads of substrate, place the chip, underfill and reflow the package.

Thus it is apparent that the present invention provides an integrated processing method of assembling a solder bumped chip device that combines the advantage of void free capillary flow underfilling and integrated solder reflow and underfill cure process as further illustrated in FIG. 7. While the invention has been described and illustrated with reference to the preferred embodiments, it is not intended to restrict or in any way limit the scope of the present invention. It is common to those skilled in the art to have additional modifications, variations, substitutions and equivalents in practicing the invention without departing from the spirit of current invention as defined by the appended claims.

What is claimed is:

1. A process for assembling a substrate and solder bumped chip, said process comprising:
   providing said chip having a plurality of bumps formed on the bottom side thereof, said bumps having a surface facing toward said substrate;
   providing said substrate having a plurality of bond pads on the top surface thereof;
   applying a tacky thermosettable flux only to the bumps attached to said chip or to said substrate bond pads;
   mounting said chip on said substrate such that each of said solder bumps resides on one of said bond pads and is adhered to said substrate by said tacky thermosettable flux, and, upon mounting, a gap is formed between said chip and said substrate due to the presence of solder bumps;
   dispensing an underfill material around the said sides of said chip; and
   subjecting said substrate and said chip to a reflow process.

2. The process of claim 1 wherein said reflow process also results in said underfill flowing between said component and said substrate.

3. The process of claim 2 wherein said reflow process also results in curing of said underfill.

4. The process of claim 1 wherein said underfill flows between said component and said substrate before said reflow process is begun.

5. A process for assembling a substrate and solder bumped chip, said process comprising:
   providing said chip having a plurality of bumps formed on the bottom side thereof, said bumps having a surface facing toward said substrate;
   providing said substrate having a plurality of bond pads on the top surface thereof;
   applying a tacky thermosettable flux only to the bumps attached to said chip or to said substrate bond pads;
   mounting said chip on said substrate such that each of said solder bumps resides on one of said bond pads and is adhered to said substrate by said tacky thermosettable flux, and, upon mounting, a gap is formed between said chip and said substrate due to the presence of solder bumps;
   dispensing an underfill material around the said sides of said chip; and
   subjecting said substrate and said chip to a reflow process, wherein applying said tacky thermosettable flux further comprises placing said flux in a flux reservoir, heating said flux reservoir to a temperature $T_1$ so that a proper viscosity is provided for flux transfer, enabling a high volume manufacturing process.

6. A process for assembling a substrate and solder bumped chip, said process comprising:

providing said chip having a plurality of bumps formed on the bottom side thereof, said bumps having a surface facing toward said substrate;

providing said substrate having a plurality of pads on the top surface thereof;

applying a tacky thermosettable flux to the surface of said solder bumps facing toward said substrate or to said substrate bond pads;

mounting said chip on said substrate such that each of said solder bumps resides on one of said bond pads and is adhered to said substrate by said tacky thermosettable flux, and, upon mounting, a gap is formed between said chip and said substrate due to the presence of solder bumps;

dispensing an underfill material around the said sides of said chip; and subjecting said substrate and said chip to a reflow process, wherein mounting said chip on said substrate further includes using tacky thermosettable flux to temporarily hold said chip on said substrate.

7. The process of claim 1 wherein dispensing an underfill material further includes dispensing an underfill material that has fluxing agent therein to further assist said reflow process.

8. The process of claim 1 wherein dispensing said underfill material around the sides of said chip comprises dispensing the underfill along one or two adjacent sides of the die so the underfill flows into the gap without creating entrapped voids.

9. A process for assembling a substrate and solder bumped chip, said process comprising:

providing said chip having a plurality of bumps formed on the bottom side thereof, said bumps having a surface facing toward said substrate;

providing said substrate having a plurality of pads on the top surface thereof;

applying a tacky thermosettable flux to the surface of said solder bumps facing toward said substrate or to said substrate bond pads;

mounting said chip on said substrate such that each of said solder bumps resides on one of said bond pads and is adhered to said substrate by said tacky thermosettable flux, and, upon mounting, a gap is formed between said chip and said substrate due to the presence of solder bumps;

dispensing an underfill material around the said sides of said chip; and subjecting said substrate and said chip to a reflow process, wherein said reflow process comprises a heating stage, a soaking stage, a reflow stage and a cooling stage.

10. The process of claim 9 wherein during said heating stage said underfill fills in said gap and flows out to the opposite sides from where the underfill is originally dispensed.

11. The process of claim 9 wherein during said reflow stage said underfill is pushed out to the sides of said chip and forms a fillet upon the collapse of said solder bumps.

12. A process for assembling a substrate and solder bumped chip, said process comprising:

providing said chip having a plurality of bumps formed on the bottom side thereof, said bumps having a surface facing toward said substrate;

providing said substrate having a plurality of pads on the top surface thereof;

applying a tacky thermosettable flux to the surface of said solder bumps facing toward said substrate or to said substrate bond pads;

mounting said chip on said substrate such that each of said solder bumps resides on one of said bond pads and is adhered to said substrate by said tacky thermosettable flux, and, upon mounting, a gap is formed between said chip and said substrate due to the presence of solder bumps;

dispensing an underfill material around the said sides of said chip; and subjecting said substrate and said chip to a reflow process, wherein said tacky thermosettable flux is selected from the group consisting of epoxy fluxes, polyimide fluxes, polyacrylate fluxes, polyurethane fluxes, and combinations thereof.

13. The process of claim 1 wherein mounting said chip on said substrate further includes heating said substrate to a temperature of approximately 20–130 C, to facilitate said underfill flow.

* * * * *